United States Patent [19]

Rhodes et al.

[11] Patent Number: 5,502,771
[45] Date of Patent: Mar. 26, 1996

[54] CLOCK RADIO VOLUME CONTROL APPRARATUS

[75] Inventors: Joseph Rhodes; Michael Delamere, both of Trenton, N.J.

[73] Assignee: Delfitz, Inc., Trenton, N.J.

[21] Appl. No.: 402,259

[22] Filed: Mar. 10, 1995

[51] Int. Cl.[6] .................................................. H03G 3/00
[52] U.S. Cl. ........................................ 381/104; 455/232.1
[58] Field of Search ..................................... 381/104, 105, 381/107, 109; 455/177.1, 200.1, 232.1, 233.1

[56] References Cited

U.S. PATENT DOCUMENTS

| | | |
|---|---|---|
| 3,251,182 | 5/1966 | Marble . |
| 3,873,921 | 3/1975 | Petriuec .................... 455/232.1 |
| 4,060,973 | 12/1977 | Martino . |
| 4,166,358 | 9/1979 | Tremblay et al. . |
| 4,203,279 | 5/1980 | Kamiya . |
| 4,205,519 | 6/1980 | Deruns . |
| 4,370,067 | 1/1983 | Iwakura et al. . |
| 4,373,821 | 2/1983 | Morishige . |
| 4,377,345 | 3/1983 | Yamada et al. . |
| 4,481,674 | 11/1984 | Silva ........................ 455/231 |
| 4,879,699 | 11/1989 | Sakamoto . |
| 4,964,108 | 10/1990 | Ohtsu et al. . |
| 5,153,580 | 10/1992 | Pollack . |
| 5,170,159 | 12/1992 | Kawabata et al. . |
| 5,243,568 | 9/1993 | Burch et al. . |
| 5,253,230 | 10/1993 | Kuo . |
| 5,313,523 | 5/1994 | Kawauchi . |

FOREIGN PATENT DOCUMENTS 0048145  4/1979  Japan ........................ 381/104

*Primary Examiner*—Curtis Kuntz
*Assistant Examiner*—Duc Nguyen
*Attorney, Agent, or Firm*—Sperry, Zoda & Kane

[57] ABSTRACT

A clock radio volume control apparatus including a conventional volume control apparatus and a supplemental volume control device for use in operation of the clock radio in sleep mode at substantially reduced volume levels including electronic means for controlling whether the conventional volume control or the sleep volume control is activated based upon a timer or other sleep switch responsive to energize a relay for choosing the sleep or standard mode of operation. A delay device is included to prevent a momentary significant increase in volume at the end of the sleep period for a predetermined time to prevent awakening of a user.

19 Claims, 2 Drawing Sheets

CLOCK RADIO VOLUME CONTROL APPRARATUS

BACKGROUND OF THE INVENTION

1. Field of the Invention

The present invention deals with the field of devices for controlling the volume of a radio. In particular the present invention is usable with respect to controlling volume on a clock radio which includes a clock radio alarm device thereon. Furthermore the present invention is most particularly usable with the clock radio having a radio alarm as well as having a sleep mode operable to play the radio for a predetermined time as the user falls asleep under low volume conditions.

2. Description of the Prior Art

Many prior art devices have been patented for controlling volume of radios or clocks or alarm mechanisms such as shown in U.S. Pat. No. 3,251,182 issued May 17, 1966 to C. Marble and assigned to General Electric Company on a "Variable Loudness Alarm Mechanism"; and U.S. Pat. No. 4,060,973 issued Dec. 6, 1977 to D. Martino on an "Automatic Variable-Sound Alarm Clock"; and U.S. Pat. No. 4,166,358 issued Sep. 4, 1979 to D. Tremblay et al and assigned to General Time Corporation on a "Solid State Alarm For Clock-Radio"; and U.S. Pat. No. 4,203,279 issued May 20, 1980 to M. Kamiya on a "Timepiece Which Permits Freely Adjusting The Level Of Sounds Produced Therein And Given Out Thereof"; and U.S. Pat. No. 4,205,519 issued Jun. 3, 1980 to N. Deruns and assigned to Ebauches Electroniques SA on an "Electronic Time-Piece With Acoustic Signal, For Signalling A Particular Working Mode"; and U.S. Pat. No. 4,370,067 issued Jan. 25, 1983 to R. Iwakura et al and assigned to Citizen Watch Company Limited on an "Electronic Timepiece With Gain/Loss Adjustment"; and U.S. Pat. No. 4,373,821 issued Feb. 15, 1983 to M. Morishige and assigned to Casio Computer Co., Ltd. on an "Electronic Timepiece Generating Different Alarm Sounds For Respective Different Regions"; and U.S. Pat. No. 4,377,345 issued Mar. 22, 1983 to S. Yamada et al and assigned to Rhythm Watch Company, Limited on an "Alarm Signaling Circuit For Timepiece"; and U.S. Pat. No. 4,481,674 issued Nov. 6, 1984 to W. Silva on a "Sleep Switch Volume Control"; and U.S. Pat. No. 4,879,699 issued Nov. 7, 1989 to Y. Sakamoto and assigned to Seiko Epson Corporation on an "Audio Output Device"; and U.S. Pat. No. 4,964,108 issued Oct. 16, 1990 to M. Ohtsu et al and assigned to Sony Corporation on a "Volume Control For Sound Reproducing Apparatus"; and U.S. Pat. No. 5,153,580 issued Oct. 6, 1992 to J. Pollack and assigned to RCA Thomson Licensing Corporation on a "Retriggerable Sleep Timer With User-Prompting Mode Operation"; and U.S. Pat. No. 5,170,159 issued Dec. 8, 1992 to Y. Kawabata et al and assigned to Pioneer Electronic Corporation on a "Sleep Timer For Audio/Visual Apparatus And Method Of Sleep Timer Operation"; and U.S. Pat. No. 5,243,568 issued Sep. 7, 1993 to N. Burch et al on a "Bioclock"; and U.S. Pat. No. 5,253,230 issued Oct. 12, 1993 to D. Kuo on an "Alarm Clock With An Switch Button Assembly"; and U.S. Pat. No. 5,313,523 issued May 17, 1994 to Y. Kawauchi and assigned to Kabushiki Kaisha Toshiba on a "Sound Volume Controlling Apparatus".

SUMMARY OF THE INVENTION

The present invention provides a clock radio volume control apparatus with a selectively operable supplemental volume control means which can be used in the sleep mode to significantly reduce the radio volume and yet not affect the radio volume used for the awakening alarm whenever the alarm is next operated. The design includes a speaker interconnected to a primary switch or primary relay. This relay will include a relay coil and a common terminal electrically connected to the speaker to supply signal thereto for audible transmission. A first terminal will be in steady state electrically closed with respect to the common terminal responsive to de-energizing of the relay coil. The common terminal will be movable with respect to the first terminal to a position electrically open with respect thereto responsive to energizing of the relay coil. This common terminal will preferably be normally closed with respect to the first terminal.

The primary relay will also include a second terminal being normally electrically open with respect to the common terminal responsive to de-energizing of the relay coil. The common terminal will also be movable with respect to the second terminal to a position electrically closed with respect thereto responsive to energizing of the relay coil. This common terminal will preferably be normally open with respect to the second terminal.

The apparatus of the present invention further includes a primary volume control device including a primary potentiometer adapted to selectively receive a radio input signal to control volume thereof. This primary volume control is electrically connected with respect to the first terminal of the primary switch.

The primary potentiometer further includes a primary resistor which is grounded preferably and a primary wiper which is electrically connected with respect to the first terminal. The primary wiper is movable with respect to the primary resistor to control the volume of the electrical signal provided to the first terminal.

A sleep volume control means is included which has a sleep potentiometer electrically connected to receive a radio input control for controlling volume thereof. The sleep volume control is electrically connected with respect to the second terminal of the primary switch. The sleep volume control is positioned electrically between the radio input signal and the primary switch.

The sleep potentiometer further includes a sleep resistor which is preferably grounded. Furthermore the sleep potentiometer will include a sleep wiper electrically connected with respect to the second terminal. This sleep wiper will be movable with respect to the sleep resistor to control volume of electrical signal provided to the second terminal means.

The volume control apparatus of the clock radio of the present invention will further include a coil control means which is operative to control energizing and de-energizing of the relay coil. This coil control means preferably includes a sleep switch movable to a first position to transmit a sleep control signal therefrom and movable to a second position to cease generating of the sleep signal therethrough. The coil control further includes a transistor having an emitter, a base and a collector wherein the base is electrically connected to the sleep switch to receive a sleep control signal therefrom. This transistor is preferably responsive to receiving of a sleep control signal to be turned on. The transistor is adapted to be turned off if no sleep control signal is applied to the base thereof. The collector of the transistor further is electrically connected to the relay coil for energizing thereof responsive to the transistor being turned on and for de-energizing of the relay coil responsive to the transistor being turned off. The coil control further includes a load means preferably comprising a current limiting resistor electrically positioned between the base of the transistor and the sleep switch to control current supplied to the transistor base.

The coil control means further includes a relay coil de-energizing delay controller. The delay apparatus may include a delay capacitor connected to the transistor emitter and through the delay current limiting resistor to the base such as to be responsive to energizing of the transistor to become charged. This delay capacitor is responsive to moving of the sleep switch to the second position to discharge through the current limiting resistor load to keep the transistor turned on and the relay coil energized for a predetermined period of time after movement of the sleep switch to the second position thereby constituting the desired delay.

The delay controller further includes a delay diode positioned electrically in series between the sleep switch and the resistor load means and between the sleep switch and the delay capacitor to force discharging of the delay capacitor through the transistor to keep the transistor turned on and the relay coil energized for a predetermined period of time after movement of the sleep switch to the second position.

The apparatus of the present invention may further include a coupling capacitor positioned in series with respect to the primary volume control and in series with respect to the sleep volume control. The apparatus may further include a post-amplifier positioned in series between the common terminal and the speaker means. Finally the present invention may include a protection diode positioned electrically in parallel across the relay coil means for protection of the transistor from voltage spiking or current surging applied thereto.

It is an object of the present invention to provide a clock radio volume control apparatus having a selectively operable supplemental volume control means for use in a sleep mode wherein low volume radio operation is achieved during sleep mode.

It is an object of the present invention to provide a clock radio volume control apparatus having a selectively operable supplemental volume control means for use in a sleep mode wherein higher volume radio operation is achieved during alarm mode.

It is an object of the present invention to provide a clock radio volume control apparatus having a selectively operable supplemental volume control means for use in a sleep mode wherein low volume is achievable during sleep mode and high volume is achievable during a subsequent alarm mode.

It is an object of the present invention to provide a clock radio volume control apparatus having a selectively operable supplemental volume control means for use in a sleep mode wherein two separate volume controls are positioned in parallel with respect to one another for mutually exclusive operation in the sleep mode or alarm mode.

It is an object of the present invention to provide a clock radio volume control apparatus having a selectively operable supplemental volume control means for use in a sleep mode wherein a relay means is operable to switch between sleep volume control and standard volume control.

It is an object of the present invention to provide a clock radio volume control apparatus having a selectively operable supplemental volume control means for use in a sleep mode wherein protection of the transistor from current surges and voltage spikes is achieved by positioning a diode extending across the coil of the relay.

It is an object of the present invention to provide a clock radio volume control apparatus having a selectively operable supplemental volume control means for use in a sleep mode wherein a delay circuit device will delay activation of the standard volume control apparatus after cessation of the sleep mode signal for a predetermined period of time of approximately one to two seconds.

It is an object of the present invention to provide a clock radio volume control apparatus having a selectively operable supplemental volume control means for use in a sleep mode wherein the additional costs for inclusion within an original equipment radio is minimized.

It is an object of the present invention to provide a clock radio volume control apparatus having a selectively operable supplemental volume control means for use in a sleep mode wherein maintenance is minimized.

It is an object of the present invention to provide a clock radio volume control apparatus having a selectively operable supplemental volume control means for use in a sleep mode wherein reliability is enhanced.

It is an object of the present invention to provide a clock radio volume control apparatus having a selectively operable supplemental volume control means for use in a sleep mode wherein a clock radio can be more universally used in both a sleep mode and alarm mode.

BRIEF DESCRIPTION OF THE DRAWINGS

While the invention is particularly pointed out and distinctly claimed in the concluding portions herein, a preferred embodiment is set forth in the following detailed description which may be best understood when read in connection with the accompanying drawings, in which:

DETAILED DESCRIPTION OF THE PREFERRED EMBODIMENT

Figure 1:
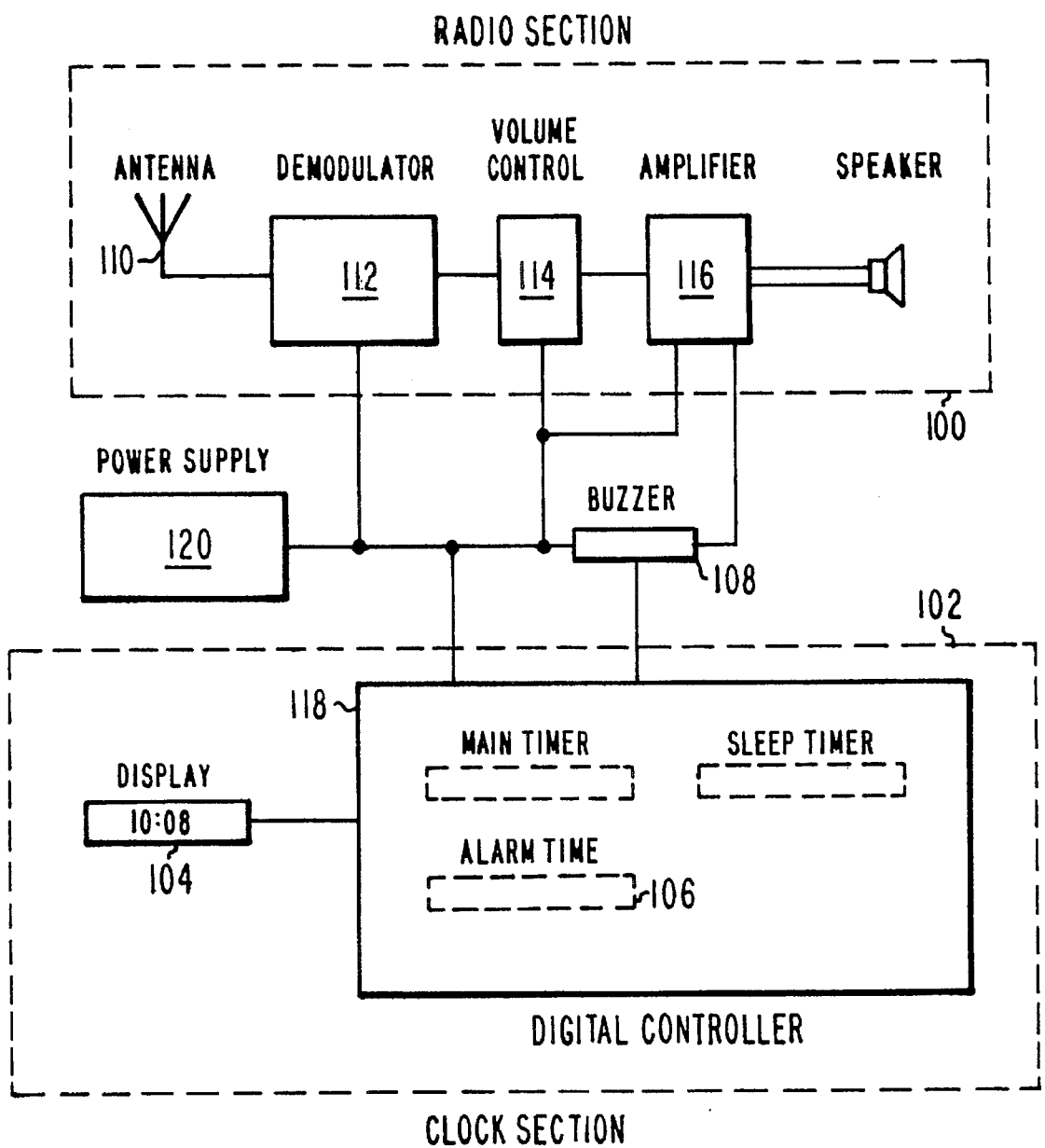
FIG. 1 is a general schematic illustration of a clock radio of the prior art.

A clock radio is a device which typically combines the features of an alarm clock 100 and a radio receiver 102. The current time of day is displayed at 104, and a present alarm time is displayed at 106. A buzzer 108 is included and/or a radio receiver 100 is activated to awaken the user. A radio is generally provided to sound for a specific period of time upon receipt of a command from the user. This can often be used to allow the user to listen to the radio while waiting to fall asleep. This is referred hereinafter as the Sleep function. This device will incorporate controls to allow the user to set the current time 104, the alarm time 106 and to activate the Sleep function, cancel the alarm, and otherwise operationally control the system.

A diagram of the major functional blocks of a typical clock radio of the prior art is shown in FIG. 1. The simplest and first internal division is between the clock function 102 normally being digital and a radio 100 which is controlled by the clock 102.

The radio will generally consist of an antenna 110 to detect the desired radio signal, a demodulator section 112 which will extract the speech/music signal, a volume control 114 to adjust the sound to a suitable level and an amplifier 116 to drive the speaker 118 to emit the actual sound.

The clock function 102 consists of a display device 104 to show the current time and a digital controller 118 which measures the passage of time and updates the display device appropriately. The controller also stores the alarm time 106 as set by the user and may use a secondary timer to measure out the Sleep period. Signals from the controller 118 are used to turn on or off the radio section 100 in response to the Sleep function and/or the Alarm function or to trigger the buzzer in response to the Alarm function. In addition, a common power supply 120 can be usable in order to provide the energy necessary for the proper operation of all circuitry.

Figure 3:
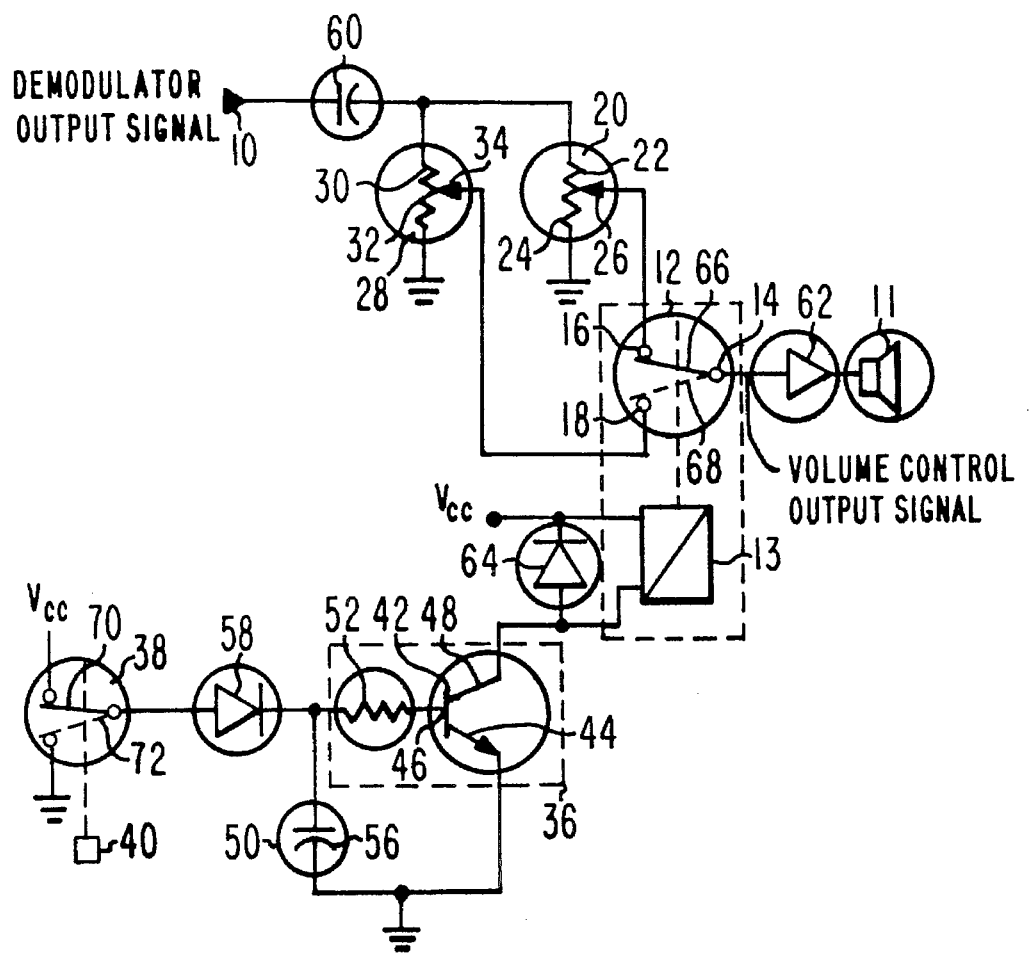
FIG. 3 is a schematic diagram of an embodiment of a clock radio volume control apparatus of the present invention.

The invention described hereinbelow details an improved device which greatly enhances the operation of a clock radio when the Sleep function is active without detracting from the appliance when used in any other mode. Specifically, the device replaces the existing radio volume control circuit 114 with an improved one as shown in FIG. 3 in which the volume is additionally dependent on whether or not the Sleep function is activated.

The improvement of the present invention provides a clock radio volume control apparatus which is adapted to receive a clock radio input signal 10 for being electrically carried to a speaker 11. There are two paths of movement of the clock radio input signal 10 to the speaker 11 one of which takes it through the circuitry of the primary volume control means 20 and the other of which takes it through the circuitry of the sleep volume control means 28.

A primary switch or primary relay 12 is adapted to select by which path the clock radio input signal 10 travels to the speaker 11. With the configuration shown in FIG. 2, when the relay coil 13 of the primary relay 12 is in the de-energized state, the clock radio input signal 10 will travel through the primary volume control 20. This path of movement is chosen since the relay coil 13 when de-energized will allow the primary relay 12 to assume the normally closed position with the common terminal 14 and the first terminal 16 electrically closed with respect to one another. As such, with this configuration, the clock radio input signal 10 will travel through the primary volume control means 20 to the first terminal 16 and through the primary switch 12 to the common terminal 14 and on to the speaker 11. However, when the relay coil 13 is energized, the first terminal 16 becomes electrically open with respect to the common terminal 14 and the second terminal of the relay 12 becomes electrically closed with respect to the common terminal 14. As such, with the relay coil 13 energized the clock radio input signal 10 will be caused to pass through the sleep volume control means 28 for control thereof by the volume control 28 associated with sleep. Thus, the clock radio input signal 10 will travel through the sleep volume control means 28 to the second terminal 18 along the primary switch 12 to the common terminal 14 and on to the speaker 11. The volume emanating from the speaker 11 will normally be a lower volume when running through the sleep volume control 28 than when running through the primary volume control 20.

The primary volume control 20 will preferably include a primary potentiometer 22 having a primary resistor 24 with a primary wiper means 26 movable therealong to vary the signal extending from the primary wiper 26 to the first terminal 16 of the relay 12.

In a similar manner the sleep volume control means will include a sleep potentiometer 30 having a sleep resistor 32 with a sleep wiper 34 connected thereto. Sleep wiper 34 is directly connected to the second terminal 18 for communicating the clock radio input signal thereto at a controlled volume level.

Figure 2:
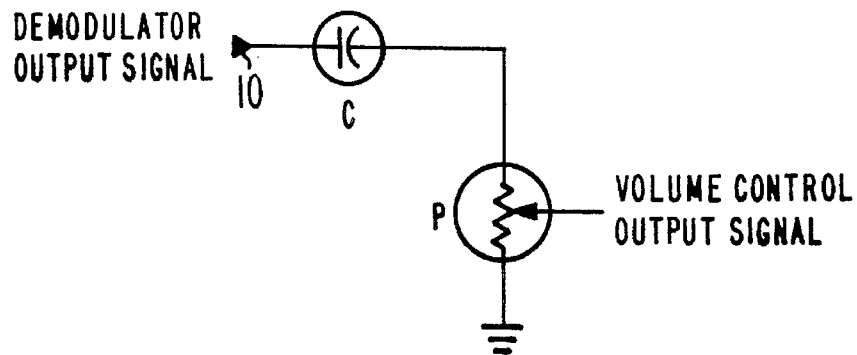
FIG. 2 is a schematic illustration of a volume control apparatus of the prior art.

The movement of the primary relay 12 between the standard volume mode position 66 and the sleep volume mode position 68 as shown in FIG. 2 is controlled by controlling energizing of the relay coil 13.

Energizing of relay coil 13 is achievable by operation of the coil control 36. Coil control circuitry 36 includes a sleep switch 38 which may include a sleep timer means 40 associated therewith for maintaining the sleep switch 38 in the first position 70 for a predetermined period of time during which a sleep signal is transmitted. Coil control means 36 further includes a transistor 42 which includes an emitter 44, a base 46 and a collector 48 conventionally included therein. Coil control means 36 further includes a load means 52 such as a resistor positioned between the base 46 of transistor 42 to control the supply of current thereto from the sleep switch 38. Preferably the load resistor means 52 will comprises a current limiting resistor rated at approximately 10,000 ohms.

With the transistor 42 turned on it will generate an output signal therefrom to the relay coil 13 for energization thereof. Whenever the transistor 42 is off the relay coil 13 will be in the de-energized state. Thus, the transistor 42 has direct one-to-one control of activation of the relay coil 13 and therefore also directly controls movement of the primary switch or primary relay 12 between the standard volume mode 66 and the sleep volume mode 68. Furthermore the transistor 42 when activated by movement of the sleep switch 38 to the first position 70 will cause the volume of the clock radio input signal 10 to be controlled by the sleep volume control means 28. On the other hand, when the sleep switch 38 is in the second position 72 with no sleep signal being transmitted, the relay coil 13 will be de-energized causing the primary relay 12 to be closed between the common terminal 14 and the first terminal 16 to cause control of the clock radio input signal by the primary volume control means 20.

It is well known that when a clock radio is turned off there will be a short period immediately after shut down where the signal will continue to be generated through the output speaker 11 resulting from the internal capacitors discharging. This can create a problem when a clock radio is being operated in the sleep mode. For example, when the sleep timer 40 reaches the end of the predetermined time period, the sleep switch 38 will move to the second position 72 thereby de-energizing the relay coil 13 and shifting control of the clock radio input signal from the sleep volume control 28 to the primary volume control 20. This may occur immediately prior to discharge of the internal capacitors within the clock radio thereby allowing a surge of the clock radio input signal 10 to travel for an instant through the primary volume control means 20 on to the speaker 11 which would result in a short burst of high volume radio sound emanating therefrom. This is obviously a problem and can be overcome by the use of a relay coil de-energizing delay means 50 as disclosed in the present invention.

The relay coil de-energizing delay means 50 of the present invention is designed to delay de-energization of the relay coil 13 for a short period of time of approximately one to two seconds immediately after movement of the sleep switch 38 to the second position 72 or termination of the predetermined time period by the sleep timer 40. The relay coil de-energizing delay means 50 can include a delay capacitor means 56 connected electrically to the emitter 44 of transistor 42 and also connected to the load resistor 52. This delay capacitor 56 is preferably of a rating of approximately 56 microfarads. The actual length of the delay is determined by the product of the electrical ratings of the resistor 52 and the delay capacitor 56. A delay diode 58 is preferably positioned between the delay capacitor 56 and the sleep switch 38. In operation, when the sleep switch 38 is initially set to the first position 70, the delay capacitor 56 will charge to its maximum capacity and remain charged as long as the sleep switch 38 is in the first position 70.

However, when the sleep switch 38 is moved to the second position 72, power being supplied to the base 46 of the transistor 42 will cease. Normally the transistor 42 would start to turn off. However, prior to allowing the transistor 42 to turn off, the delay capacitor 56 will start to discharge in a controlled manner through the resistor 52 and through the base 46 of transistor 42. The delay capacitor 56 will take a period of time of approximately one to two seconds to fully discharge due to the approximately 10,000 ohms rating of the current limiting resistor 52. The delay diode 58 will prevent discharging to the left as shown in FIG. 2 and will force all discharge of the delay capacitor 56 to occur through the base 46 of transistor 42 thereby maintaining the transistor 42 turned on for a time period of approximately one to two seconds after movement of the sleep switch 38 to the second position. In this manner the control of the clock radio input signal 10 by the sleep volume control means 28 will be extended for a period of one to two seconds after movement of the sleep switch 38 to the second position 72, thereby preventing a high volume output signal emanating from the speaker 11 for a short period of time immediately upon termination of the sleep time period.

This delay of one to two seconds is deemed to be adequate to ensure that the clock radio is completely silent with all the capacitors therein completely discharged whenever control of the clock radio input signal is transferred from the sleep volume control 28 to the primary volume control 20.

The power supply for the improved circuit design of the present invention is provided by the original design already available in any conventional clock radio. As such, no additional power supply will be needed. The sleep switch 38 is positionable between two positions, namely first position 70 and second position 72, shown in FIG. 2. Vcc represents the positive terminal of the clock radio power supply and the ground symbol designates the negative terminal thereof. Vcc is the high side normally being of approximately 9 volts and the ground side is the low voltage side. Vcc is shown connected to the high side of the sleep switch 38 as well as to the protection diode 64.

While particular embodiments of this invention have been shown in the drawings and described above, it will be apparent, that many changes may be made in the form, arrangement and positioning of the various elements of the combination. In consideration thereof it should be understood that preferred embodiments of this invention disclosed herein are intended to be illustrative only and not intended to limit the scope of the invention.

I claim:

1. A clock radio volume control apparatus having a selectively operable supplemental volume control means for use in sleep mode, said apparatus comprising:

A. a speaker means;
   B. a primary switch means including:
      (1) a relay coil means;
      (2) a common terminal means electrically connected to said speaker means to supply a signal thereto for audible transmission therefrom;
      (3) a first terminal means being normally electrically closed with respect to said common terminal means responsive to de-energizing of said relay coil means, said common terminal means and said first terminal means being responsive to become electrically open responsive to energizing of said relay coil means;
      (4) a second terminal means being normally electrically open with respect to said common terminal responsive to de-energizing of said relay coil means, said common terminal means and said second terminal means being responsive to become electrically closed responsive to energizing of said relay coil means;
   C. a primary volume control means including a primary potentiometer means adapted to selectively receive a radio input signal to control volume thereof, said primary volume control means being electrically connected with respect to said first terminal means of said primary switch means;
   D. a sleep volume control means including a sleep potentiometer means adapted to receive a radio input signal to control volume thereof, said sleep volume control means being electrically connected with respect to said second terminal means of said primary switch means, said sleep volume control means being positioned electrically between the radio input signal and said primary switch means;
   E. a coil control means operative to control energizing and de-energizing of said relay coil means, said coil control means including:
      (1) a sleep switch means movable to a first position to transmit a sleep control signal therethrough and movable to an second position to cease generating of any electrical signal therethrough;
      (2) a transistor means including an emitter means, a base means and a collector means, said base means being electrically connected to said sleep switch means to receive a sleep control signal therefrom and said transistor means being responsive to receiving a sleep control signal to become turned on and being otherwise turned off, said collector means of said transistor means being electrically connected to said relay coil means for energizing thereof responsive to said transistor means being turned on and for de energizing of said relay coil responsive to said transistor means being turned off;
      (3) a load means positioned electrically between said base means of said transistor means and said sleep switch means to control current supplied to said base means of said transistor means;
      (4) a relay coil de-energizing delay means comprising:
         (a) a delay capacitor means electrically connected to said emitter of said transistor means, said delay capacitor means being responsive to energizing of said transistor means to become charged, said delay capacitor means being responsive to moving of said sleep switch means to the second position to discharge through said load means and said transistor means to maintain said transistor means turned on and said relay coil energized for a predefined period of time after movement of said sleep switch means to the second position; and
         (b) a delay diode means positioned electrically in series between said sleep switch means and said load means and between said sleep switch means and said delay capacitor means to force discharging of said delay capacitor means through said base of said transistor means to keep said transistor means turned on and said relay coil means energized for a defined period of time after movement of said sleep switch means to the second position.

2. A clock radio volume control apparatus having a selectively operable supplemental volume control means for use in sleep mode as defined in Claim 1 wherein said first terminal means comprises a normally closed terminal electrically closed with respect to said common terminal means responsive to de-energizing of said relay coil means.

3. A clock radio volume control apparatus having a selectively operable supplemental volume control means for use in sleep mode as defined in Claim 1 wherein said second terminal means comprises a normally open terminal electrically closed with respect to said common terminal means responsive to energizing of said relay coil means.

4. A clock radio volume control apparatus having a selectively operable supplemental volume control means for use in sleep mode as defined in Claim 1 further comprising a coupling capacitor positioned in series with respect to said primary volume control means and in series with respect to said sleep volume control means.

5. A clock radio volume control apparatus having a selectively operable supplemental volume control means for use in sleep mode as defined in Claim 1 wherein said primary potentiometer means includes primary resistor means and a primary wiper means electrically connected with respect to said first terminal means, said primary wiper means being movable with respect to said primary resistor means to control volume of the electrical signal provided to said first terminal means.

6. A clock radio volume control apparatus having a selectively operable supplemental volume control means for use in sleep mode as defined in Claim 5 wherein said primary resistor means is grounded.

7. A clock radio volume control apparatus having a selectively operable supplemental volume control means for use in sleep mode as defined in Claim 1 wherein said sleep potentiometer means includes sleep resistor means and a sleep wiper means electrically connected with respect to said second terminal means, said sleep wiper means being movable with respect to said sleep resistor means to control volume of the electrical signal provided to said second terminal means.

8. A clock radio volume control apparatus having a selectively operable supplemental volume control means for use in sleep mode as defined in Claim 7 wherein said sleep resistor means is grounded.

9. A clock radio volume control apparatus having a selectively operable supplemental volume control means for use in sleep mode as defined in Claim 1 further comprising a post-amplifier means positioned in series between said common terminal means and said speaker means.

10. A clock radio volume control apparatus having a selectively operable supplemental volume control means for use in sleep mode as defined in Claim 1 wherein said load means comprises a resistor means.

11. A clock radio volume control apparatus having a selectively operable supplemental volume control means for use in sleep mode as defined in Claim 1 wherein said load means comprises a current limiting resistor means.

12. A clock radio volume control apparatus having a selectively operable supplemental volume control means for use in sleep mode as defined in Claim 1 wherein said sleep switch includes a timer means therein for controlling the duration of operation of the clock radio volume control apparatus in the sleep mode.

13. A clock radio volume control apparatus having a selectively operable supplemental volume control means for use in sleep mode as defined in Claim 1 wherein said relay coil de-energizing delay means is operable to delay de-energizing of said relay coil means for a period of time of approximately one to two seconds.

14. A clock radio volume control apparatus having a selectively operable supplemental volume control means for use in sleep mode as defined in Claim 1 further including a protection diode means positioned electrically in parallel across said relay coil means for protection of said transistor means from voltage and current spiking and surging therethrough.

15. A clock radio volume control apparatus having a selectively operable supplemental volume control means for use in sleep mode as defined in Claim 1 wherein said primary switch means comprises a primary relay means.

16. A clock radio volume control apparatus having a selectively operable supplemental volume control means for use in sleep mode as defined in Claim 1 wherein said delay capacitor means has a capacitance value of approximately 56 microfarads.

17. A clock radio volume control apparatus having a selectively operable supplemental volume control means for use in sleep mode as defined in Claim 1 wherein said load means comprises a current limiting resistor means having a value of approximately ten thousand ohms.

18. A clock radio volume control apparatus having a selectively operable supplemental volume control means for use in sleep mode as defined in Claim 1 wherein said common terminal means is movable between a position electrically closed with respect to said first terminal means and electrically open with respect to said second terminal means and a position electrically open with respect to said first terminal means and electrically closed with respect to said second terminal means.

19. A clock radio volume control apparatus having a selectively operable supplemental volume control means for use in sleep mode, said apparatus comprising:

A. a speaker means;

B. a primary switch means comprising a primary relay means including:
  (1) a relay coil means;
  (2) a common terminal means electrically connected to said speaker means to supply a signal thereto for audible transmission therefrom;
  (3) a first terminal means being normally electrically closed with respect to said common terminal means responsive to de energizing of said relay coil means, said common terminal means and said first terminal means being responsive to become electrically open responsive to energizing of said relay coil means;
  (4) a second terminal means being normally electrically open with respect to said common terminal responsive to de-energizing of said relay coil means, said common terminal means and said second terminal means being responsive to become electrically closed responsive to energizing of said relay coil means, said common terminal means being movable between a position electrically closed with respect to said first terminal means and electrically open with respect to said second terminal means and a position electrically open with respect to said first terminal means and electrically closed with respect to said second terminal means;

C. a primary volume control means including a primary potentiometer means adapted to selectively receive a radio input signal to control volume thereof, said primary volume control means being electrically connected with respect to said first terminal means of said primary switch means, said primary potentiometer means including a primary resistor means and a primary wiper means electrically connected with respect to said first terminal means, said primary wiper means being movable with respect to said primary resistor means to control volume of the electrical signal provided to said first terminal means, said primary resistor means being grounded;

D. a sleep volume control means including a sleep potentiometer means adapted to receive a radio input signal to control volume thereof, said sleep volume control means being electrically connected with respect to said second terminal means of said primary switch means, said sleep volume control means being positioned electrically between the radio input signal and said primary switch means, said sleep potentiometer means including a sleep resistor means and a sleep wiper means electrically connected with respect to said second terminal means, said sleep wiper means being movable with respect to said sleep resistor means to control volume of the electrical signal provided to said second terminal means, said sleep resistor means being grounded;

E. a coil control means operative to control energizing and de-energizing of said relay coil means, said coil control means including:
  (1) a sleep switch means movable to a first position to transmit a sleep control signal therethrough and movable to a second position to cease generating of any electrical signal therethrough, said sleep switch means including a timer means therein for controlling the duration of operation of the clock radio volume apparatus in the sleep mode;
  (2) a transistor means including an emitter means, a base means and a collector means, said base means being electrically connected to said sleep switch means to receive a sleep control signal therefrom and said transistor means being responsive to receiving a sleep control signal to become turned on and being otherwise turned off, said collector means of said transistor means being electrically connected to said relay coil means for energizing thereof responsive to said transistor means being turned on and for de energizing of said relay coil responsive to said transistor means being turned off;
  (3) a load means positioned electrically between said base means of said transistor means and said sleep switch means to control current supplied to said base means of said transistor means, said load means comprising a current limiting resistor means for controlling current supplied to said base means of said transistor means;
  (4) a relay coil de-energizing delay means comprising:
    (a) a delay capacitor means electrically connected to said emitter of said transistor means, said delay capacitor means being responsive to energizing of said transistor means to become charged, said delay capacitor means being responsive to moving of said sleep switch means to the second position to discharge through said load means and said transistor means to maintain said transistor means turned on and said relay coil energized for approximately one to two seconds after movement of said sleep switch means to the second position;
    (b) a delay diode means positioned electrically in series between said sleep switch means and said load means and between said sleep switch means and said delay capacitor means to force discharging of said delay capacitor means through said base of said transistor means to keep said transistor means turned on and said relay coil means energized for a defined period of time after movement of said sleep switch means to the second position;

F. a coupling capacitor positioned electrically in series with respect to said primary volume control means and with respect to said sleep volume control means;

G. a post-amplifier means positioned in series between said common terminal means and said speaker means for further signal amplification; and H. a protection diode means positioned electrically in parallel across said relay coil means for protection of said transistor means from voltage and current spiking and surging therethrough.

* * * * *